United States Patent [19]
Komura et al.

[11] Patent Number: 5,462,896
[45] Date of Patent: Oct. 31, 1995

[54] METHOD OF FORMING A SIDEWALL ON A SEMICONDUCTOR ELEMENT

[75] Inventors: Atushi Komura, Obu; Kenji Kondo, Aichi; Akira Kuroyanagi, Okazaki, all of Japan

[73] Assignee: Nippondenso Co., Ltd., Kariya, Japan

[21] Appl. No.: 903,465

[22] Filed: Jun. 23, 1992

[30] Foreign Application Priority Data

Jun. 24, 1991 [JP] Japan ................................. 3-151993
Oct. 18, 1991 [JP] Japan ................................. 3-271430

[51] Int. Cl.[6] .................................................. H01L 21/465
[52] U.S. Cl. .............................. 437/228; 437/41; 437/44
[58] Field of Search ............................... 156/643, 656, 156/657, 345, 641, 646, 653; 437/41, 192, 44; 148/DIG. 131

[56] References Cited

U.S. PATENT DOCUMENTS

| | | | |
|---|---|---|---|
| 4,419,809 | 12/1983 | Riseman et al. | 437/44 |
| 4,528,066 | 7/1985 | Merkling, Jr. et al. | 156/657 |
| 4,577,391 | 3/1986 | Hsia et al. | 437/44 |
| 4,657,628 | 4/1987 | Holloway et al. | 156/656 |
| 4,764,245 | 8/1988 | Grewal | 156/643 |
| 4,879,254 | 11/1989 | Tsuzuki et al. | 437/41 |
| 4,879,257 | 11/1989 | Patrick | 437/195 |
| 4,886,765 | 12/1989 | Chen et al. | 437/41 |
| 4,906,589 | 3/1990 | Chao | 437/44 |
| 4,998,151 | 3/1991 | Korman et al. | 257/328 |
| 5,082,796 | 1/1992 | El-Diwany et al. | 437/44 |
| 5,094,712 | 3/1992 | Becker et al. | 156/656 |
| 5,160,398 | 11/1992 | Yanagida | 156/345 |
| 5,169,487 | 12/1992 | Langley et al. | 156/646 |
| 5,234,864 | 8/1993 | Kim et al. | 437/197 |

FOREIGN PATENT DOCUMENTS

| | | |
|---|---|---|
| 1128447 | 5/1989 | Japan . |
| 286736 | 3/1990 | Japan . |
| 324737 | 2/1991 | Japan . |

OTHER PUBLICATIONS

"Nikkei Micro Device", (Dec. 1986) pp. 105–125 and partial translation.
"Semiconductor World", (Jul. 1987), pp. 131–136 and partial translation.

Primary Examiner—Olik Chaudhuri
Assistant Examiner—H. Jey Tsai
Attorney, Agent, or Firm—Cushman, Darby & Cushman

[57] ABSTRACT

A method fabricates a semiconductor device having a sidewall made from an insulation film at each side of a gate electrode portion. The method forms a polysilicon gate electrode (11a) on a gate oxide film (10) in a predetermined region on an $n^-$ epitaxial layer (2). A CVD silicon oxide film (15) having a predetermined thickness is formed over the polysilicon gate electrode material (11a) on the $n^-$ epitaxial layer (2). A magnetron enhanced reactive ion etching apparatus is used to etch the CVD silicon oxide film (15) while pouring a $CHF_3$ gas made by coupling carbon, hydrogen, and fluorine and an $N_2$ gas onto the etched material, such that the CVD silicon oxide film (15) is left only at each side of the polysilicon gate electrode material (11a), to form a sidewall (16). To avoid electrodes of the magnetron enhanced reactive ion etching apparatus from staining, $CHF_3/He/N_2/O_2$ may be used for etching.

10 Claims, 19 Drawing Sheets

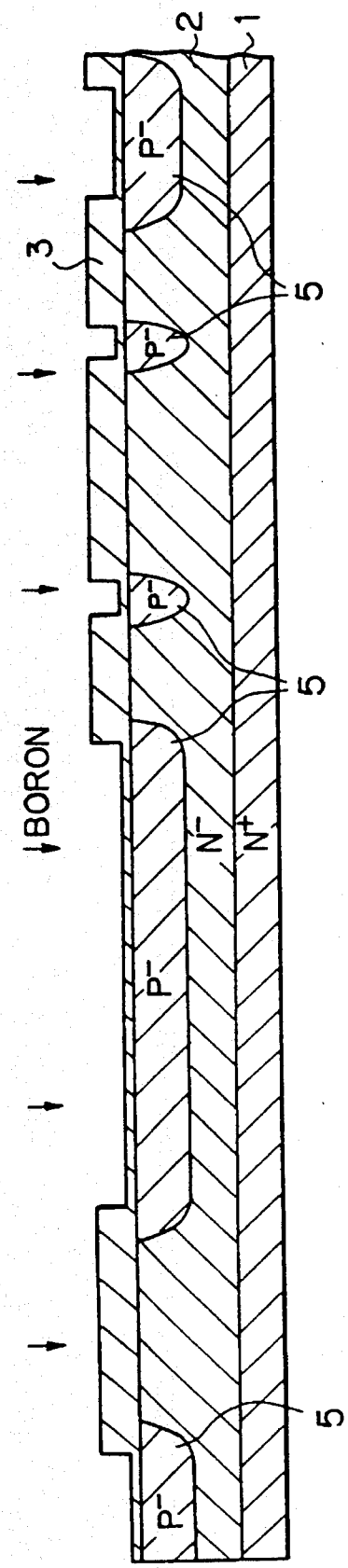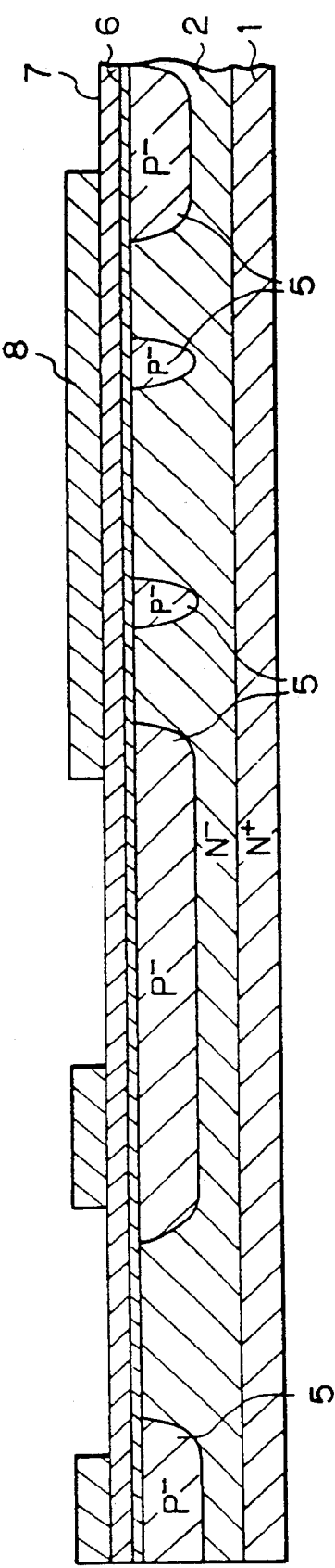

METHOD OF FORMING A SIDEWALL ON A SEMICONDUCTOR ELEMENT

BACKGROUND OF THE INVENTION

1. Field of the Invention

The present invention relates to a method of forming sidewalls around a gate electrode material of a semiconductor element.

2. Description of the Related Art

U.S. Pat. No. 4,879,254 discloses a fine technique of forming a sidewall at each side of an insulation layer of a semiconductor device by reactive ion etching and forming a transmission path by self-alignment with the insulation layer and sidewall as masks. Japanese Unexamined Patent Publication No. 2-86136 discloses a technique of forming, in a semiconductor device, a sidewall of about 1 µm thick by controlling the thickness of an insulation film to 2 to 3 µm and the side wall angle of a polysilicon gate electrode material to 80 to 90 degrees while minimizing an over-etching quantity.

According to the latter disclosure, the insulation film used for forming the sidewall is very thick at 2 to 3 µm, and the sidewall angle must be restricted to 80 to 90 degrees. The thick insulation film needs a long over-etching time when forming the sidewall, so that it is very difficult to minimize an etching effect of part that must not be etched. Accordingly, this technique has no practical use.

SUMMARY OF THE INVENTION

An object of the invention is to provide a method of fabricating a semiconductor device having a wide sidewall formed from an insulation film at each side of a gate electrode.

In order to accomplish the object, a first aspect of the invention basically comprises a step of depositing silicon (Si)-based insulation material over a substrate and a step of etching the silicon-based insulation material by a magnetron enhanced reactive ion etching apparatus while pouring carbon-fluoride (CF)-based gas containing hydrogen (H) atoms and a nitrogen (N) or helium (He) gas onto the etched material.

A second aspect of the invention basically comprises a first step of forming gate electrode material on an insulation film in a predetermined region on a semiconductor substrate, a second step of forming an insulation film having a predetermined thickness over the gate electrode material on the semiconductor substrate, and a third step of etching the insulation film by a magnetron enhanced reactive ion etching apparatus while pouring a mixture of a CF-based gas and an $H_2$ gas or a gas mainly made of carbon, coupled by hydrogen and fluorine, and an $N_2$ or He gas onto the insulation film, such that the insulation film is left at each side of the gate electrode material.

BRIEF DESCRIPTION OF THE DRAWINGS

FIGS. 2 through 15 are views showing fabricating processes of the semiconductor device;

DESCRIPTION OF THE PREFERRED EMBODIMENTS

Figure 1:
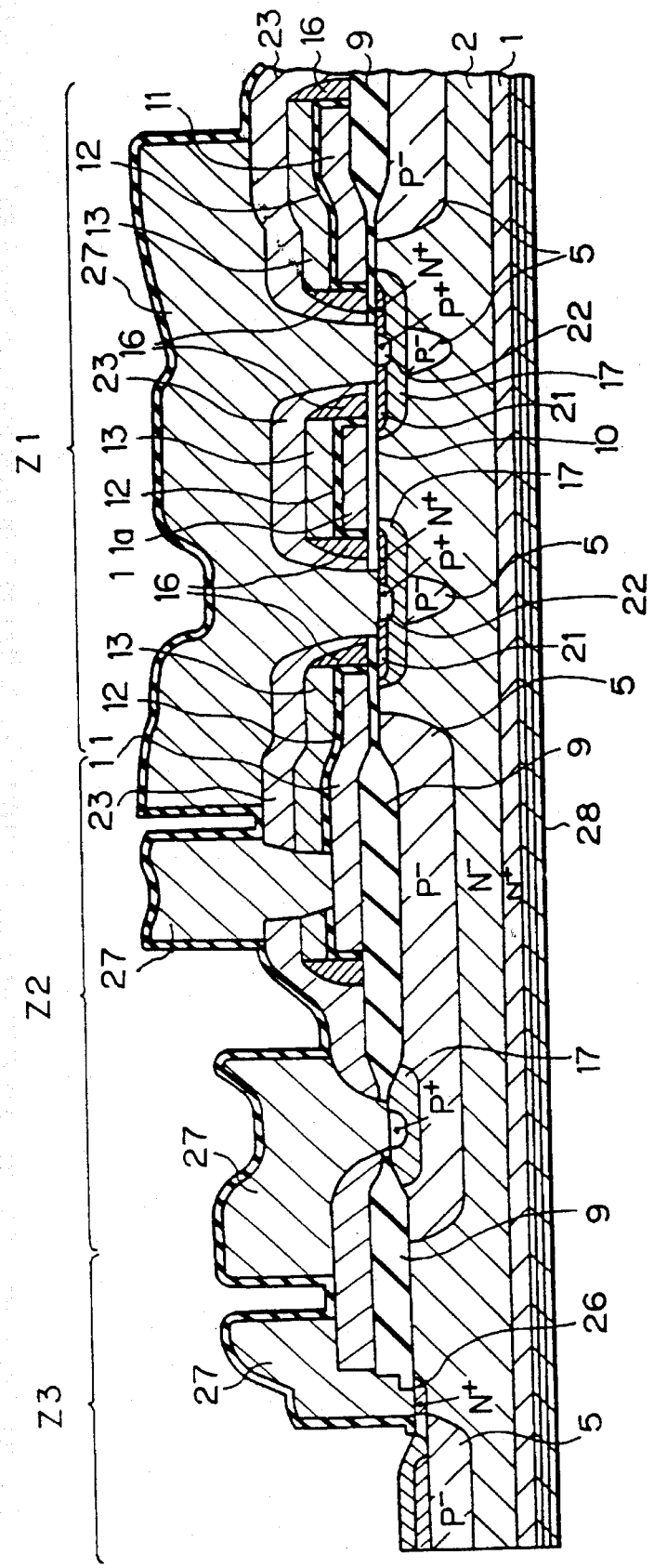
FIG. 1 is a sectional view showing a semiconductor device according to an embodiment of the invention.

A method of fabricating a semiconductor device according to the invention basically comprises a step of depositing silicon (Si)-based insulation material over a substrate and a step of etching the silicon-based insulation material by a magnetron enhanced reactive ion etching apparatus while pouring carbon-fluoride (CF)-based gas containing hydrogen (H) atoms and a nitrogen (N) or helium (He) gas onto the etched material.

This method improves the decomposing efficiency of the reactive gases and effective depositing reaction products, to form a large tapered portion from the insulation material at each side of the etched portion. The tapered portion may optionally be shaped by adjusting etching conditions. When forming, for example, aluminum wiring, the tapered portion formed at each side of the etched portion according to the invention serves as a large contact area having no acute curve, to improve wiring efficiency and avoid peeling.

The inventors have studied various etching conditions on silicon (Si)-based insulation material and found a preferable method of etching the silicon-based insulation material by using a magnetron type reactive ion etching apparatus while pouring a mixture of a carbon-fluoride-based gas containing hydrogen atoms and a nitrogen or helium gas onto the etched material.

Namely, the invention employs the magnetron enhanced reactive ion etching apparatus and the mixed gas, to produce high-concentration plasma that improves the decomposing efficiency of the reactive gas. The carbon-fluoride-based gas containing hydrogen atoms function to effectively etch the silicon-based insulation material. The nitrogen or helium gas reacts in a gas phase to easily deposit reaction products decomposed by etching over the silicon-based insulation material.

In a dry etching technique such as that employed by the invention, it is understood that the nitrogen or helium gas functions to reduce the influence of radicals mainly related to lateral etching, to thereby promote lateral deposition of reaction products at etched portions. When the reaction products are deposited at the side of the etched portion, the deposited products serve as masks against etching of ion shocks, to laterally move a part to be etched, thereby forming a tapered portion.

In addition to the mixed gas, an oxygen gas or a compound gas containing oxygen may be poured during the etching process.

The invention method etches the silicon-based insulation material formed over the substrate by using a proper mask and forms a tapered portion at the periphery of an opening of the mask.

The invention is applicable when the substrate on which the silicon-based insulation film is formed has stepped portions such as gate electrodes. In this case, the silicon-based insulation film may be wholly etched with no mask, to form a tapered portion at each side of the stepped portions such as the gate electrodes.

A second aspect of the invention basically comprises a first step of forming gate electrode material on an insulation film in a predetermined region on a semiconductor substrate, a second step of forming an insulation film having a predetermined thickness over the gate electrode material on the semiconductor substrate, and a third step of etching the insulation film by a magnetron enhanced reactive ion etching apparatus while pouring a mixture of a carbon-fluoride-based gas and an $H_2$ gas, or a gas (for example, $CHF_3$) made by coupling carbon, hydrogen, and fluorine while pouring an $N_2$ or He gas onto the insulation film. As a result, the insulation film is left only at each side of the gate electrode material.

Figure 24:
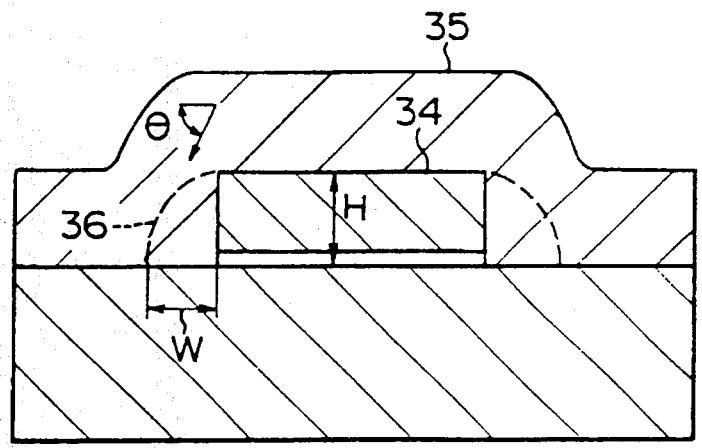
FIG. 24 is a sectional view showing a semiconductor device and an etching process.

The invention will be explained with reference to FIG. 24.

In the figure, an insulation film 35 formed over a gate electrode material 34 is etched by a magnetron enhanced reactive ion etching apparatus. At this time, a magnetron discharge generates plasma that easily produces carbon fluoride ($CF_2^*$, the mark "*" indicating a radical) as follows:

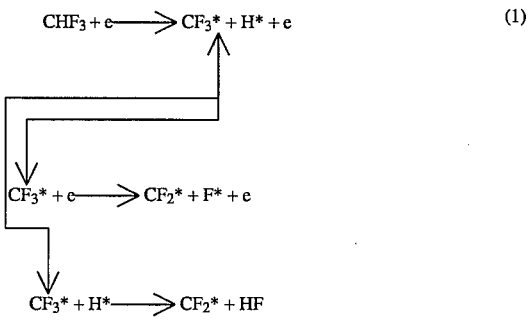

(1)

This reaction efficiently produces polymer $C_xF_y$.

Adding an $N_2$ or He gas stabilizes the production of the polymer. A competitive reaction between the polymer deposition and the etching determines etching direction (indicated with θ in FIG. 24) and the size W of a sidewall 36. The magnetron discharge and the addition of $N_2$ or He gas promote the reaction of the formula (1), to reduce the etching angle θ and increase the width W of the sidewall 36 relative to the height H of the gate electrode 34.

When an oxygen gas or a compound gas containing oxygen is added according to the second aspect of the invention, $CF_2^*$ of the formula (1) reacts with the oxygen gas or the compound gas containing oxygen as follows:

(2)

This prevents adverse effects on electrodes of the magnetron enhanced reactive ion etching apparatus.

An embodiment of the invention will be explained with reference to the drawings.

FIG. 1 shows a semiconductor device involving an n-channel vertical DMOS transistor zone Z1, a field plate zone Z2, and a peripheral zone (EQR zone) Z3. FIGS. 2 through 15 show fabricating processes of this semiconductor device.

Figure 2:
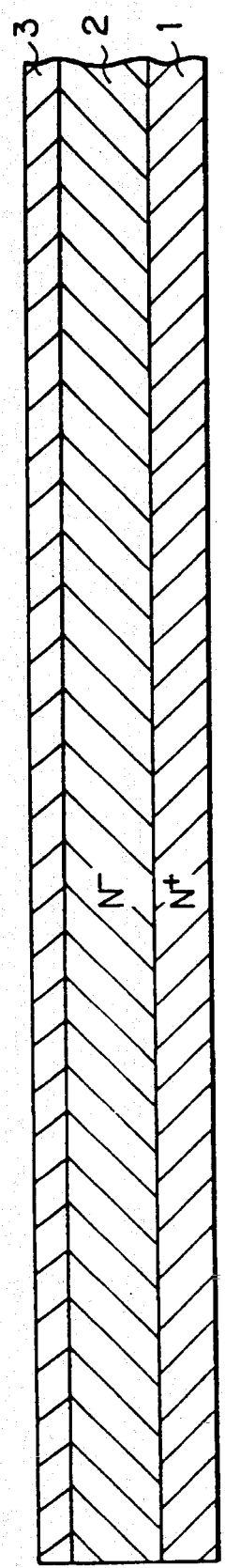

In FIG. 2, an $n^+$ silicon substrate 1 is prepared. An $n^-$ epitaxial layer 2 is formed over the silicon substrate 1. A silicon oxide film 3 of about 3000 to 5000 angstroms thick is formed over the epitaxial layer 2.

Figure 3:
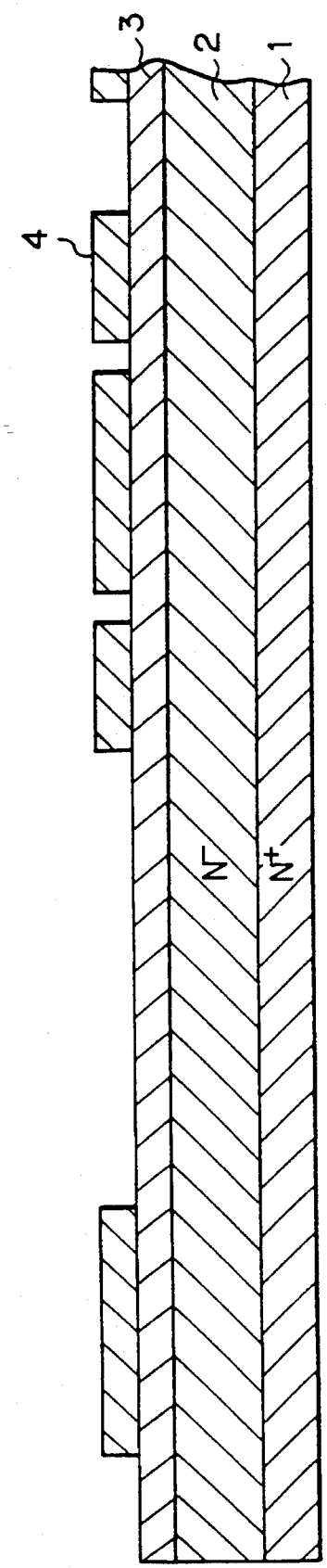

In FIG. 3, a resist 4 is used to photo-etch the silicon oxide film 3, so as to form deep $p^-$ wells.

In FIG. 4, boron ions of $3\times10^{13}$ cm$^{-2}$ dose are implanted at about 60 keV, and a drive-in is carried out at 1170 degrees centigrade for 4 to 6 hours under an $N_2$ atmosphere, to form deep $p^-$ well layers 5.

In FIG. 5, the silicon oxide film 3 is removed, and a pad oxide film 6 of about 300 to 500 angstroms thick is deposited over the epitaxial layer 2. A silicon nitride ($Si_3N_4$) film 7 of about 1000 to 2000 angstroms thick is deposited over the pad oxide film 6, and by using a resist 8, the silicon nitride film 7 is patterned by photo-etching.

Figure 6:
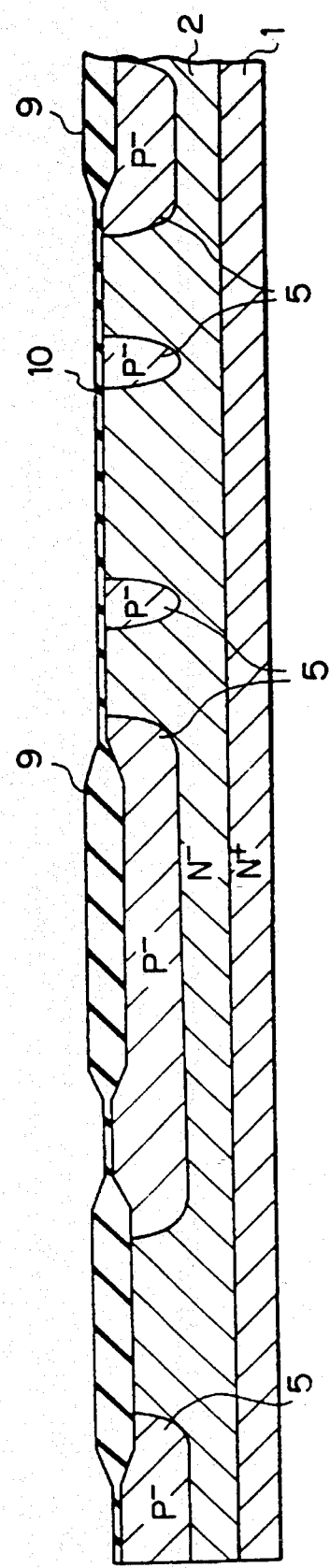

In FIG. 6, a field oxide film 9 of about 9000 to 10000 angstroms thick is formed by LOCOS oxidation. The silicon nitride film 7 is removed by hot phosphoric acid. The pad oxide film 6 is removed by HF etching. A gate oxide film 10 of about 300 to 1000 angstroms thick is formed.

Figure 7:
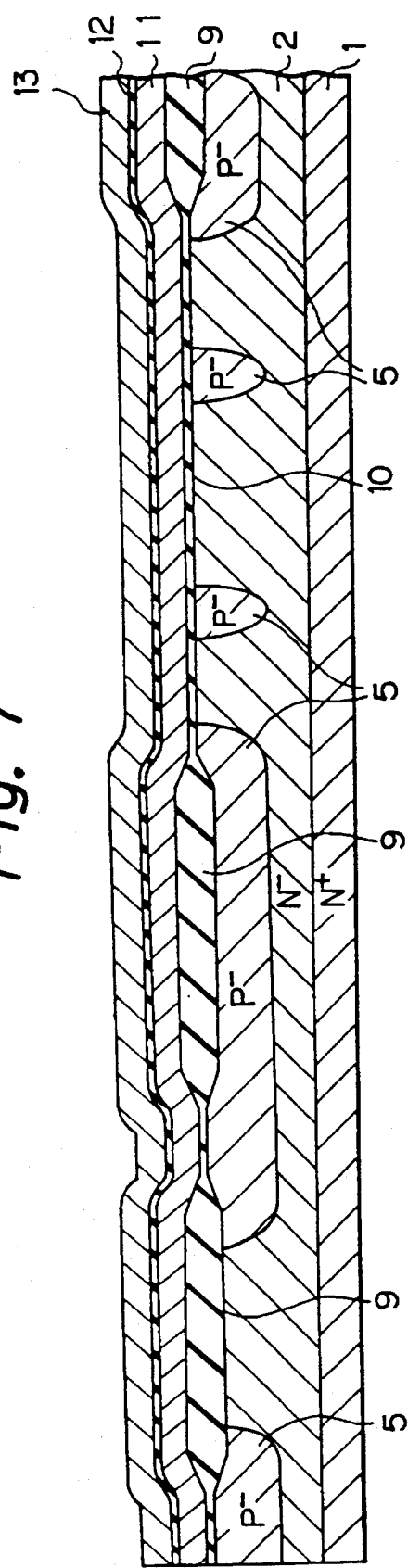

In FIG. 7, a polysilicon film (11) is entirely deposited by, for example, LPCVD to about 5000 to 10000 angstroms in thickness. Phosphorus is diffused to change the polysilicon film (11) into a phosphorus doped polysilicon film 11. The top of the phosphorus doped polysilicon film 11 is thermally oxidized to form a polysilicon oxide film 12 of about 500 to 1500 angstroms thick. A silicon oxide film 13 of about 1 µm thick is formed over the polysilicon oxide film 12.

Figure 8:
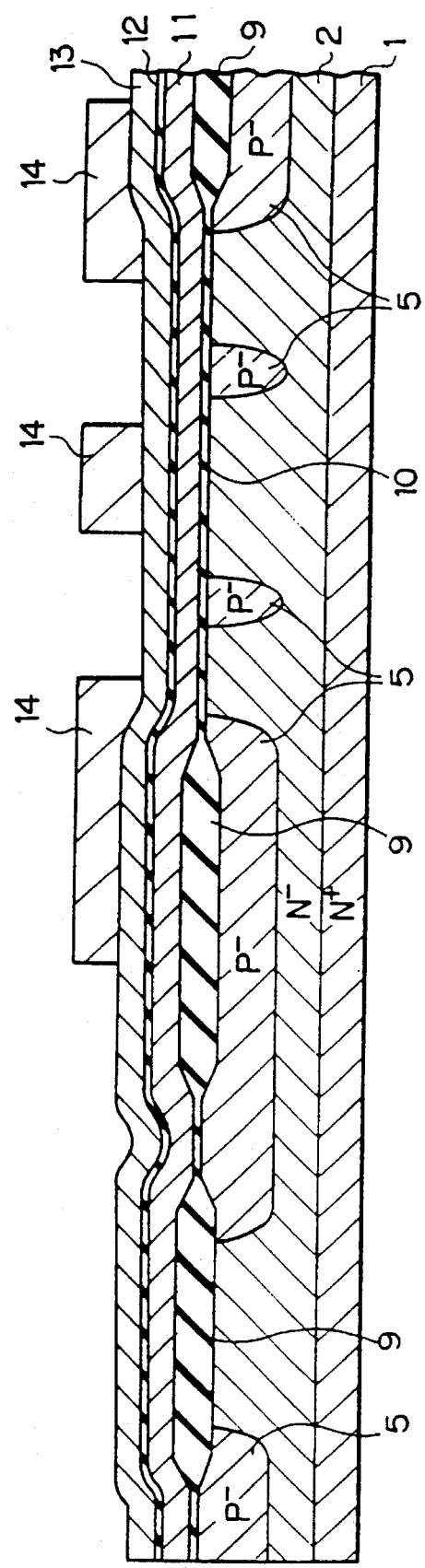

In FIG. 8, the phosphorus doped polysilicon film 11, polysilicon oxide film 12, and silicon oxide film 13 are patterned by photo-etching by using a resist 14.

Figure 9:
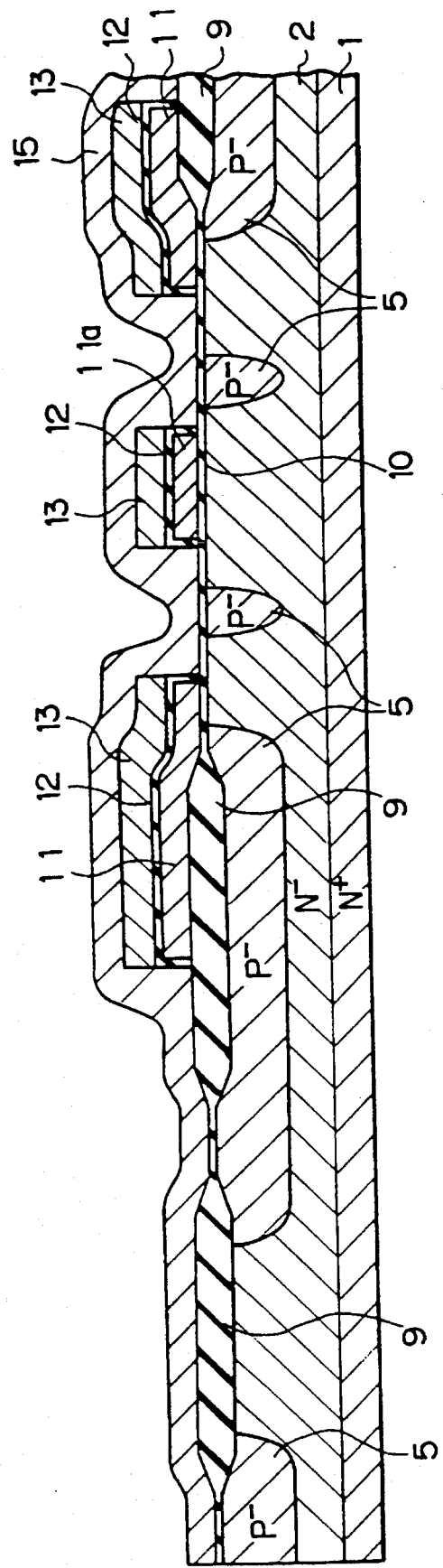

As a result, as shown in FIG. 9, a phosphorus doped polysilicon gate electrode material (hereinafter referred to only as the polysilicon gate electrode material) 11a is formed in the transistor forming region through the gate oxide film 10 on the epitaxial layer 2. Thereafter, a CVD silicon oxide film 15 of TEOS for properly covering stepped portions is formed to about 1 µm in thickness.

Figure 10:
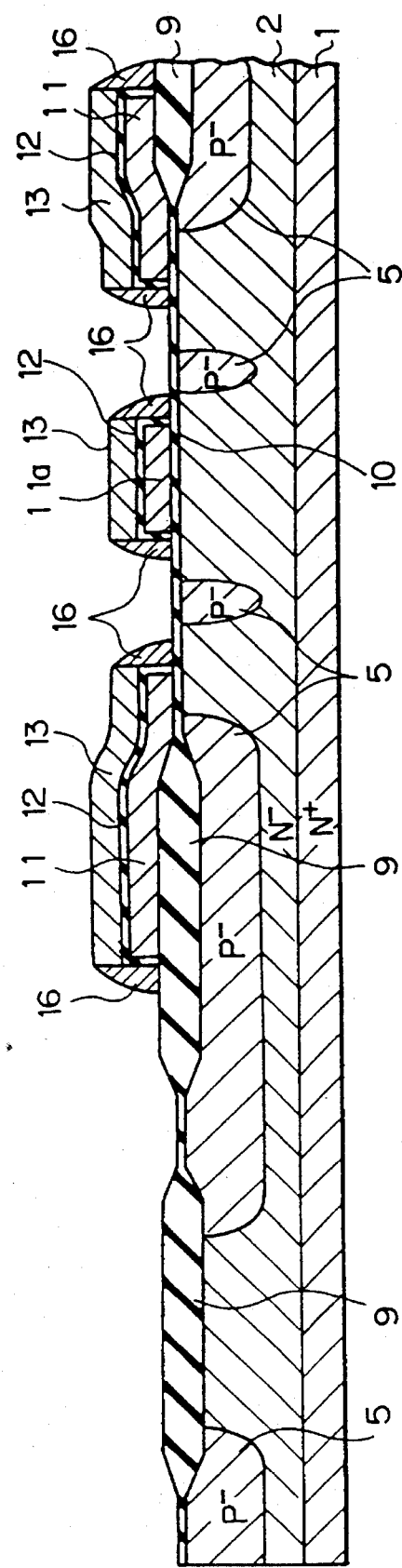

In FIG. 10, the CVD silicon oxide film 15 is etched back to form a sidewall 16 at each side of the phosphorus doped polysilicon film 11 (including the polysilicon gate electrode material 11a).

In FIG. 9, the sidewall of the phosphorus doped polysilicon gate electrode material 11a is thermally oxidized after patterning, to form the polysilicon oxide film.

Figure 16:
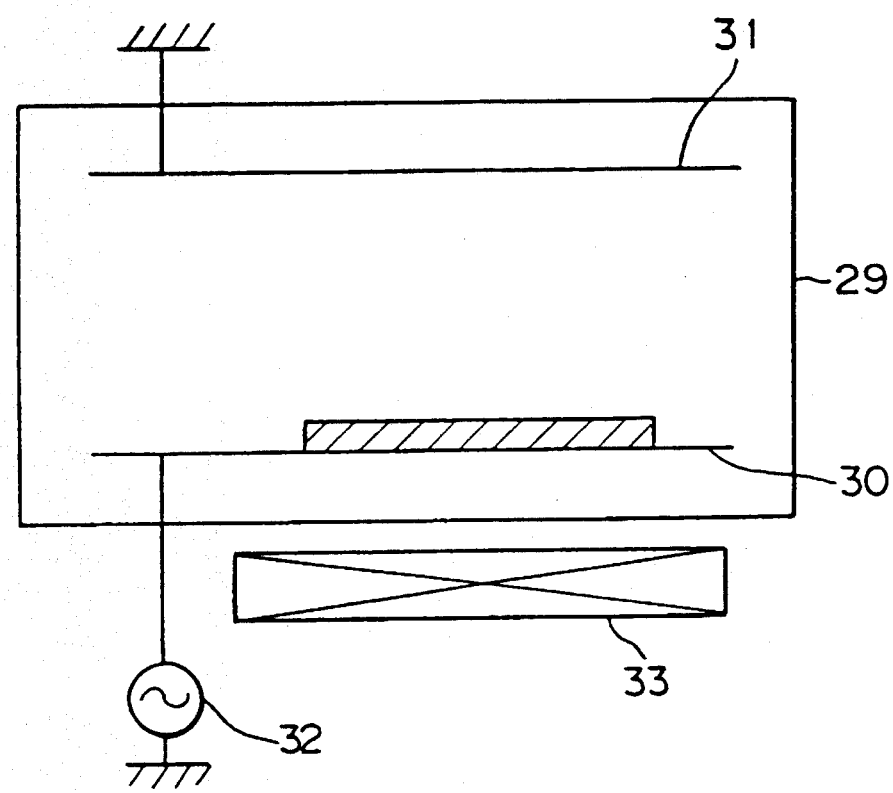
FIG. 16 is a view showing a magnetron enhanced reactive ion etching apparatus.

The sidewall 16 is formed by a magnetron enhanced reactive ion etching apparatus HiRRIE II manufactured by Tokuda Seisakusho. FIG. 16 shows this apparatus. In the figure, a chamber 29 incorporates upper and lower electrodes 30 and 31 facing each other. The upper electrode 31 is grounded. A high-frequency power source 32 supplies the lower electrode 30 with high-frequency electric power of, for example, 500 to 1000 W. An electromagnet 33 is disposed under the chamber 29, to form a magnetic field of about 800 gausses.

The semiconductor substrate of FIG. 9 is placed on the lower electrode 30 of the apparatus. The CVD silicon oxide film (sidewall forming insulation film) 15 is etched under, for example, an etching pressure of 6 to 20 Pa, a reactive gas of $CHF_3$ of 30 to 70 cc/min in flow rate, and an $N_2$ gas of 10 to 50 cc/min in flow rate, thereby forming the sidewall 16.

The width W at the bottom of the sidewall 16 is dependent on the film thickness H of a lamination of the phosphorus doped polysilicon film 11, polysilicon oxide film 12, and silicon oxide film 13. This width W of the sidewall 16 is smaller than 0.85 times the depth of the n⁺ source region 21 of FIG. 1. Namely, as described in "IEEE Transactions on Electron Devices," February 1980, Vol. ED-27, No. 2, pp. 356 through 367, lateral diffusion is 0.85 times the vertical diffusion, thereby making the width W smaller than 0.85 times the depth of the n⁺ source region 21 to form the n⁺ source region 21 under the polysilicon gate electrode material 11a.

Figure 11:
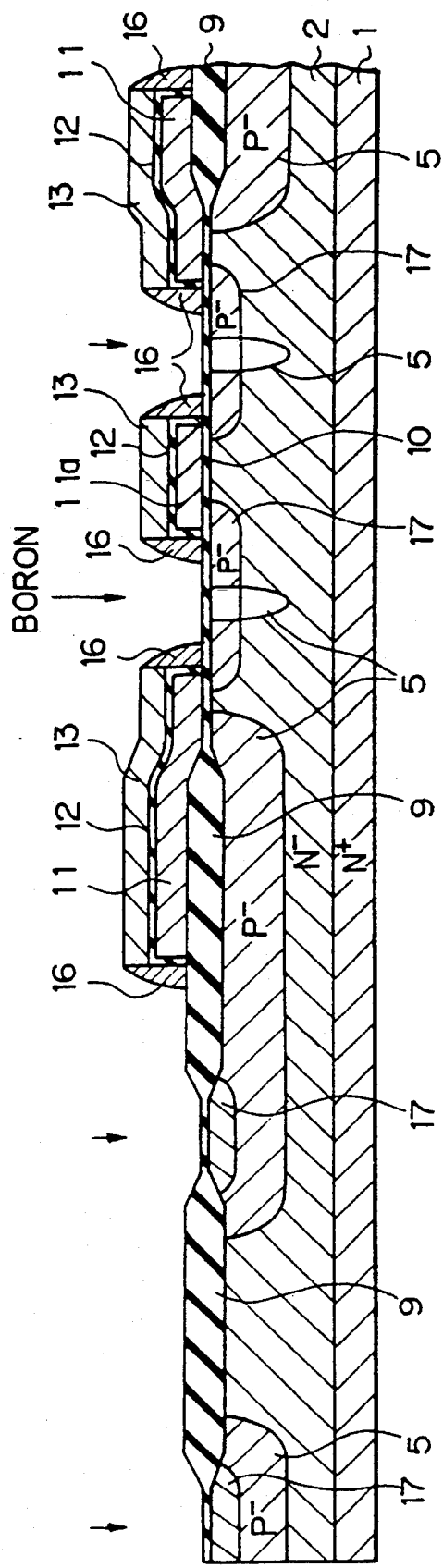

In FIG. 11, boron ions of $6 \times 10^{13}$ to $9 \times 10^{13}$ cm$^{-2}$ dose are implanted into the whole surface at 40 keV without a mask, and a drive-in operation is carried out at 1170 degrees centigrade for about 60 minutes, to form a p⁻ channel region 17.

Figure 12:
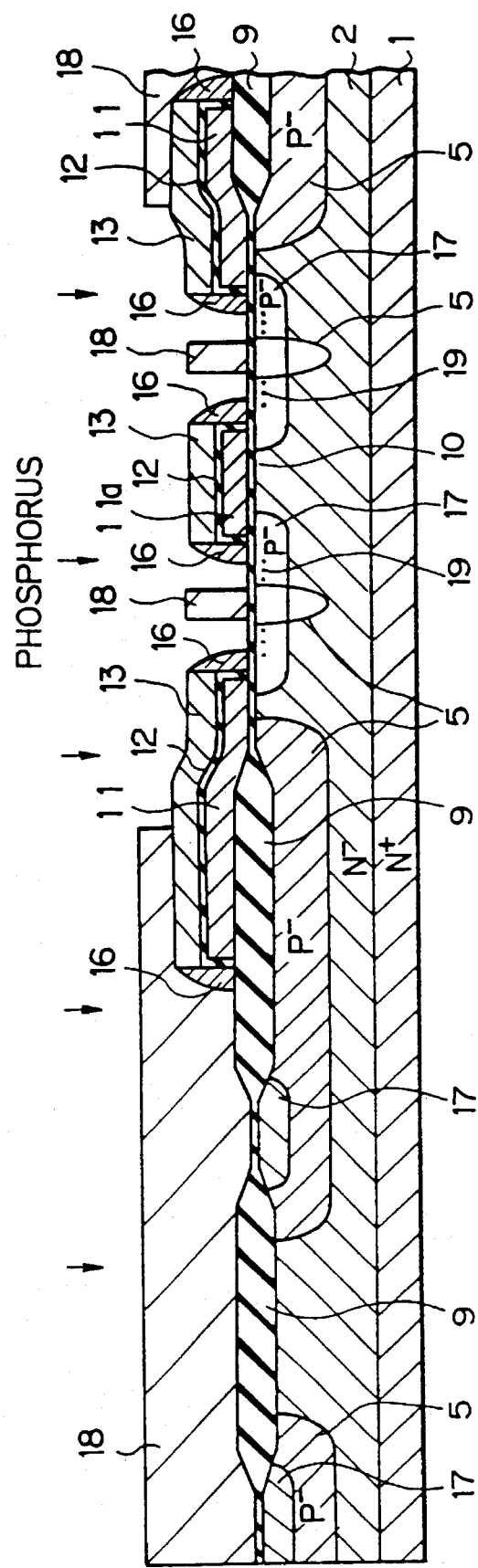

In FIG. 12, a photo-patterned mask 18 is employed to implant phosphorus of $5 \times 10^{15}$ cm$^{-2}$ dose at 13 keV, to form an n⁺ implanted region 19.

Figure 13:
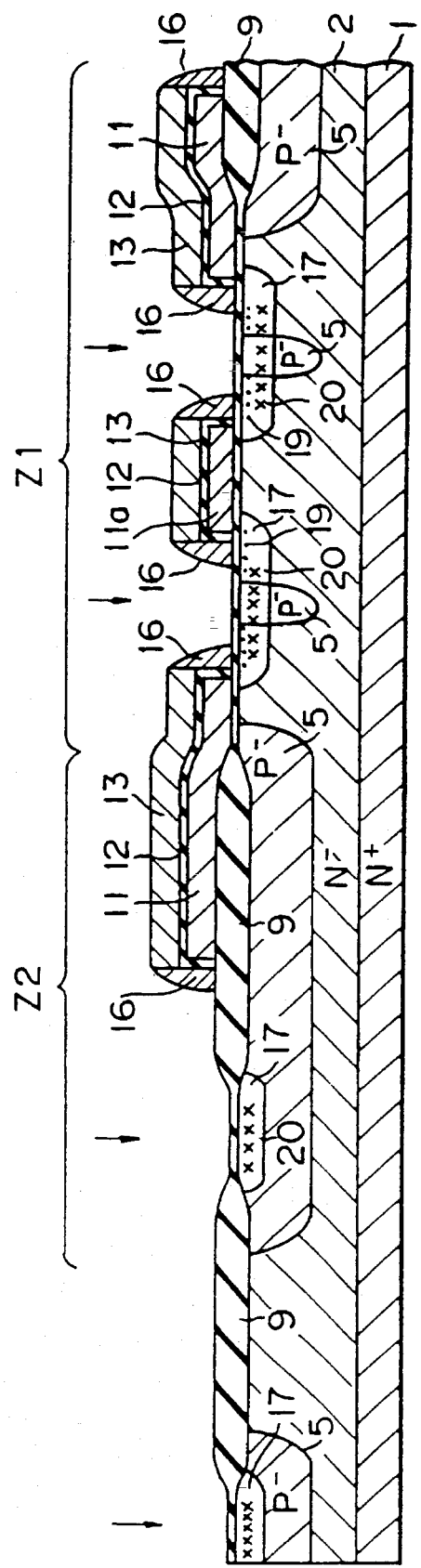

In FIG. 13, boron ions of $6 \times 10^{-4}$ cm$^{-2}$ dose are implanted at about 60 keV into the whole surface, to form a p⁺ implanted region 20, which is used to form body contacts with the p⁻ channel region 17 in the DMOS transistor zone Z1 and contacts in the field plate zone Z2.

Figure 14:
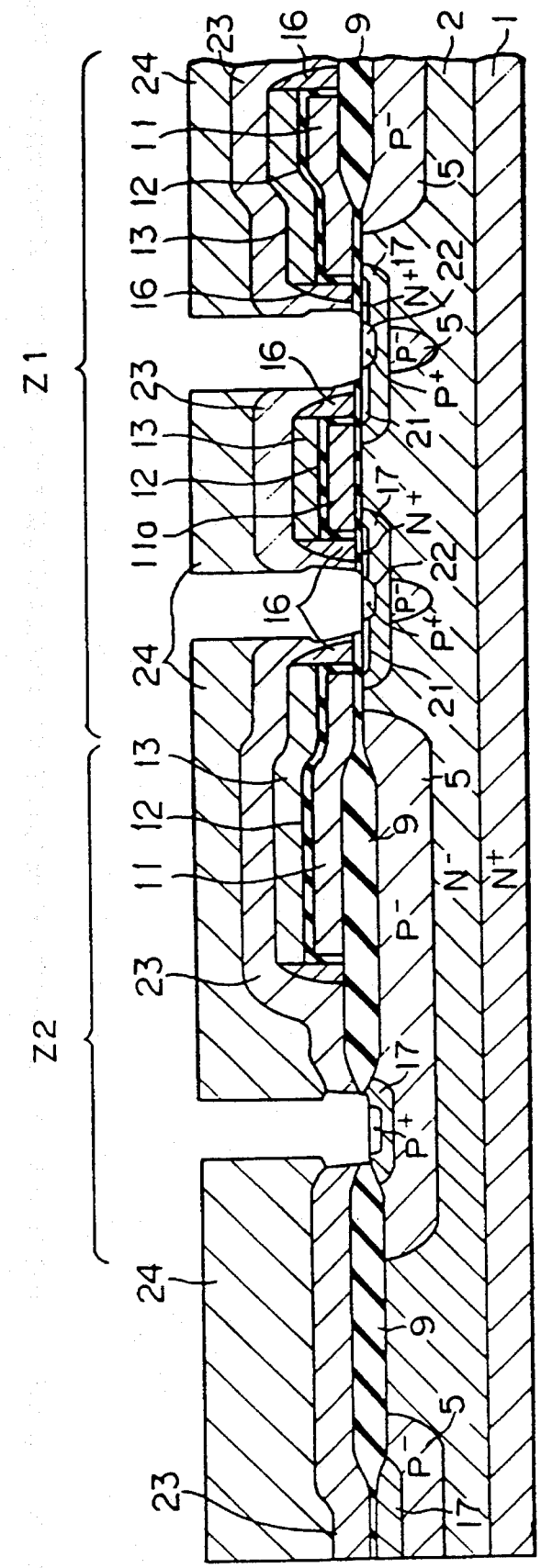

In FIG. 14, a heat treatment is carried out under an atmosphere of N₂, to form an n⁺ source region 21 and a p⁺ contact region 22. If the heat treatment is carried out at 1000 to 1050 degrees centigrade for about one hour, the depth of the n⁺ source region and the p⁺ contact region 22 will be about 0.7 to 1.2 μm. Although the n⁺ source region 21 involves implanted boron ions, the quantity of phosphorus is about 10 times larger than that of boron, so that the boron of this dose has no influence on the n⁺ source region 21.

Thereafter, a BPSG film 23 is formed over the whole surface. Predetermined regions of the BPSG film 23 are removed by photo-etching (wet or dry etching) by using a resist 24, thereby forming contact holes in the DMOS transistor zone Z1 and field plate zone Z2.

Figure 15:
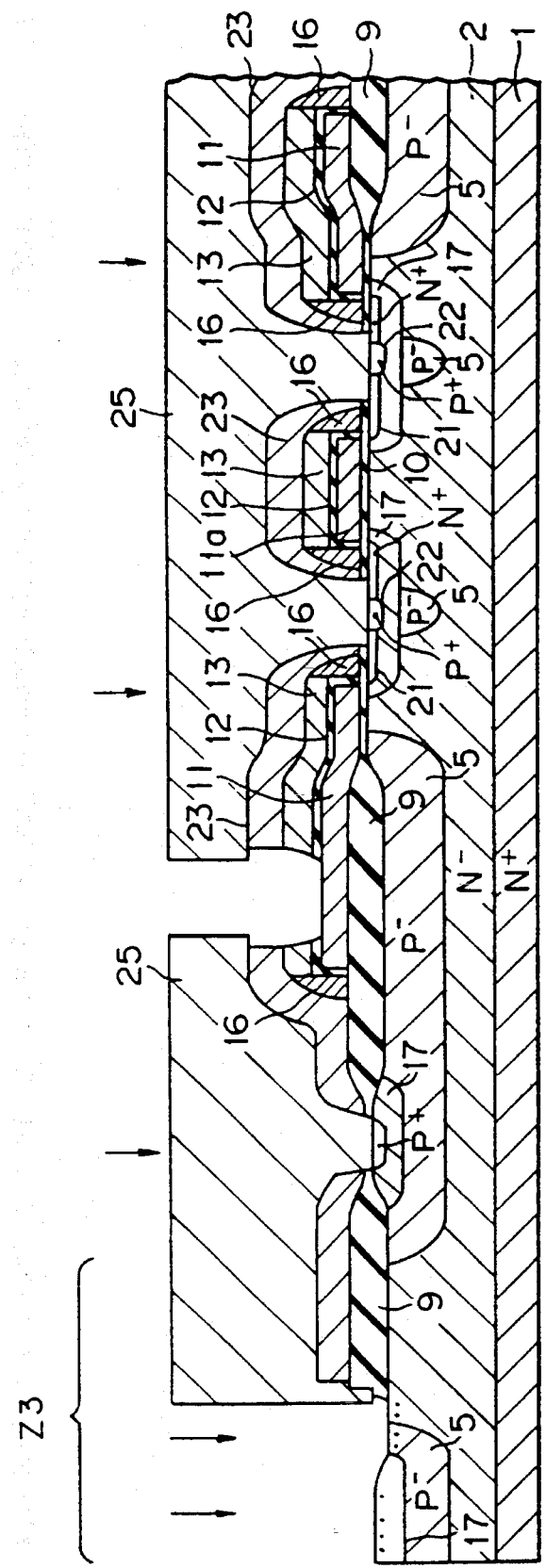

In FIG. 15, photo-etching is carried out by using a resist 25, to make contacts with the phosphorus doped polysilicon film 11. At the same time, holes are made in the peripheral zone (EQR zone) Z3.

The photo-etching for making the contacts (FIG. 14) in the DMOS transistor zone Z1 and the photo-etching for making the contacts (FIG. 15) in the phosphorus doped polysilicon film 11 are separately carried out because the contacts to the phosphorus doped polysilicon film 11 are thicker than those to the DMOS transistor zone Z1 by the thicknesses of the insulation films (the polysilicon oxide film 12 and silicon oxide film 13), thereby requiring quite different etching conditions.

As shown in FIG. 15, phosphorus ions are implanted under the same conditions as for the n⁺ source region 21, to form n⁺ contacts in the peripheral zone (EQR zone) Z3. Annealing is carried out to form an n⁺ layer 26 shown in FIG. 1. Thereafter, an aluminum electrode 27, a passivation film (not shown), and a drain electrode 28 on the back face are formed.

The semiconductor device with integrated vertical DMOS power transistors is thus completed.

In the semiconductor device formed, the polysilicon gate electrode material 11a having a predetermined width is on the gate oxide insulation film 10 formed on the epitaxial layer 2. The insulation sidewall 16 having a predetermined width is formed at each side of the electrode material 11a. The p⁻ channel region 17 is formed under the polysilicon gate electrode material 11a in the epitaxial layer 2 by implanting boron ions with the electrode material 11a and sidewall 16 as masks. The n⁺ source region 21 is formed under the polysilicon gate electrode material 11a in the p⁻ channel region 17 at a depth shallower than the depth of the region 17 and in an area smaller than the region 17 by implanting phosphorus ions with the electrode material 11a and sidewall 16 as masks.

As mentioned above, the polysilicon gate electrode material 11a having a predetermined width is formed on the gate oxide film 10, i.e., the insulation film formed on the epitaxial layer 2, i.e., the semiconductor substrate. The p⁻ channel region 17 serving as a first impurity region is positioned under the polysilicon gate electrode material 11a in the epitaxial layer 2. Also, the n⁺ source region 21 that is shallower and smaller than the region 17 is positioned under the polysilicon gate electrode material 11a in the p⁻ channel region 17. The insulation mask (sidewall) 16 is formed at each side of the polysilicon gate electrode material 11a. The width of the mask (sidewall) 16 is smaller than 0.85 times the depth of the n⁺ source region 21.

A technique for finely designing this semiconductor device is disclosed in U.S. Pat. No. 5,250,449 by this applicant so that it will not be described here.

Processes of forming the sidewall 16 by using the magnetron enhanced reactive ion etching apparatus while pouring CHF₃ gas and N₂ gas will be explained in detail.

Figure 17:
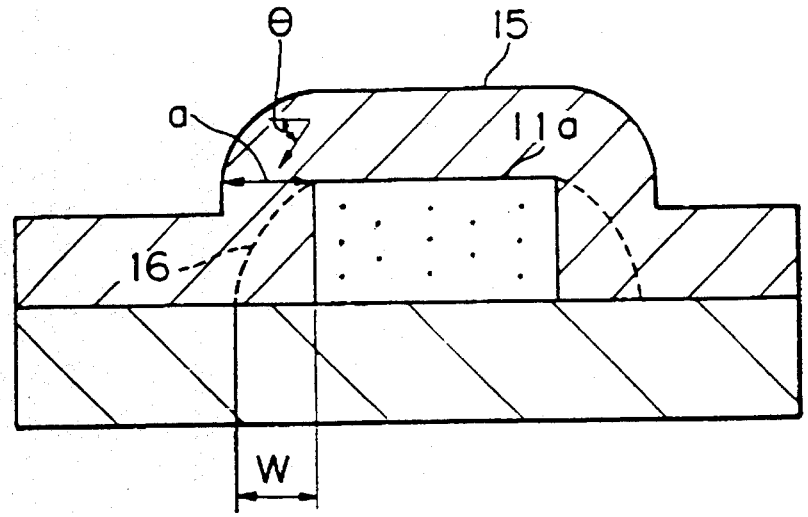
FIG. 17 is a sectional view showing a semiconductor device and an explanation of an etching process.

As shown in FIG. 17, the width W of the sidewall 16 is determined by the horizontal width "a" of the insulation film (CVD silicon oxide film) 15 at the top edge of the gate electrode material 11a and an etching anisotropy (a ratio of vertical to horizontal etching speeds). A magnetron discharge easily produces carbon fluoride such as CF₂ as indicated in the formula (1), thereby efficiently producing a polymer having a composition of $C_xF_y$ (x and y indicating a ratio of C to F), and adding N₂ stably and properly controls the production of the polymer.

The width W of the sidewall 16 is determined not only by the size "a" of FIG. 17 and the anisotropy but also by a competitive reaction between the polymer deposition and the etching. The magnetron discharge and the addition of N₂ gas promote the reaction of the formula (1), reduces the etching angle θ, and widens the width W of the sidewall 16 formed at each side of the gate electrode portion.

Figure 18:
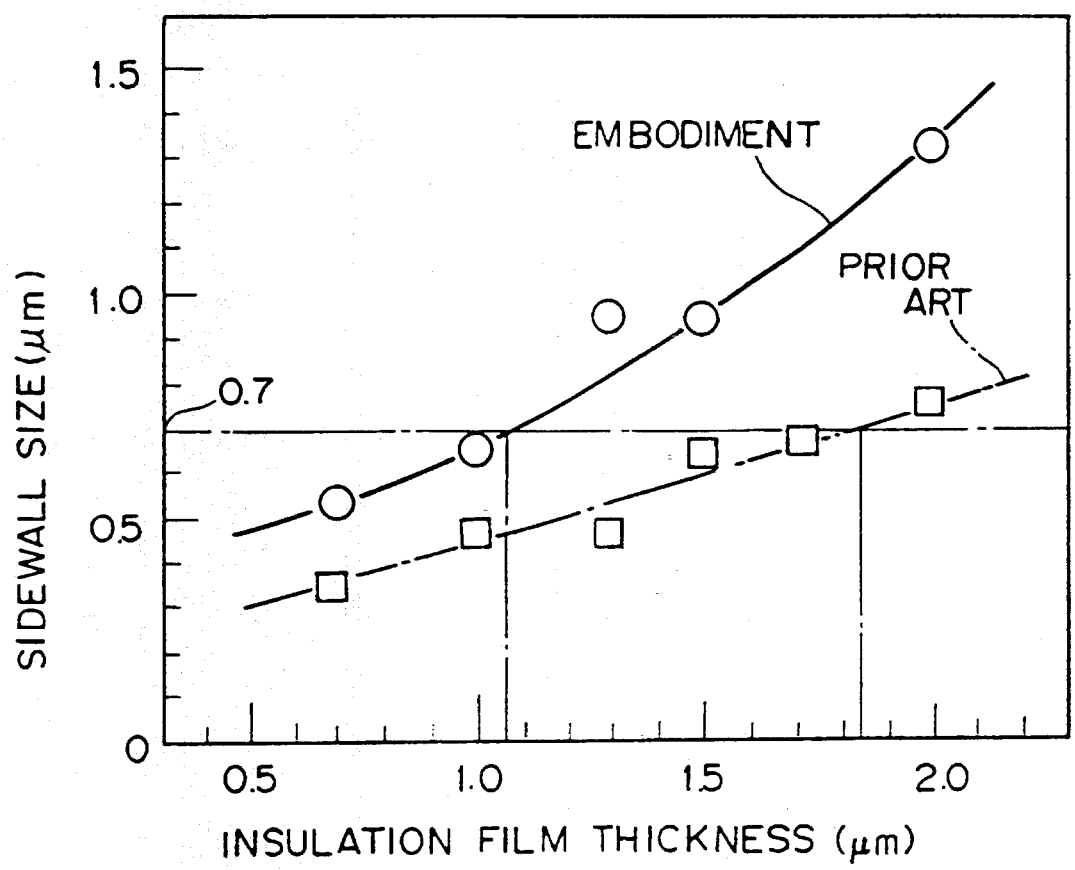
FIG. 18 is a graph showing relationships between insulation film thicknesses and sidewall sizes.

FIG. 18 shows a result of measurement of the widths W of sidewalls and the thicknesses of insulation films (CVD silicon oxide films 15). Conditions of the measurement are shown in Table 1.

The prior art shown in FIG. 18 employs a narrow gap apparatus TEL580 for etching, manufactured by Tokyo Electron.

TABLE 1

|  | First embodiment | Prior art |
| --- | --- | --- |
| Flow rate (cc/min) |  |  |
| CF₄ | — | 40 |
| CHF₃ | 50 | 40 |
| N₂ | 10 | — |
| Ar | — | 700 |
| Pressure (Pa) | 13 | 133 |
| High-frequency power (W) | 600 | 250 |
| Magnet | with | without |

To make the width W of a sidewall to be 0.7 μm, the prior art requires the silicon oxide film 15 (sidewall forming insulation film) to have a film thickness of 1.8 μm while the embodiment requires the same to have a film thickness of 1.1 μm.

As explained above, according to the embodiment method, the first step forms the polysilicon gate electrode material 11a over the gate oxide film 10 (insulation film) in a predetermined region on the n⁻ epitaxial layer 2 (semiconductor substrate), the second step forms the CVD silicon oxide film 15 (insulation film) having a predetermined thickness on the polysilicon gate electrode material 11a on the n⁻ epitaxial layer 2, and the third step employs the magnetron enhanced reactive ion etching apparatus for etching the CVD silicon oxide film 15 while pouring a $CHF_3$ gas made by coupling carbon, hydrogen, and fluoride and an $N_2$ gas onto the etched material, to leave the CVD silicon oxide film 15 only at each side of the polysilicon gate electrode material 11a.

This technique can broaden the width of the sidewall 16 formed from the CVD silicon oxide film 15 at each side of the gate electrode. Namely, for providing the same size of a sidewall, the CVD silicon oxide film 15 (sidewall forming insulation film) according to the invention will be thinner than that of the prior art, thereby shortening a deposition time of the CVD silicon oxide film 15 and the etching time required to form the sidewall, thereby improving throughput, and reducing costs.

Power MOS transistors involve deep and wide impurity diffusions Xj (diffusion depths), so that they need sidewalls each of at least 0.5 μm in width. When the sidewalls are used as electric insulation and separation layers with self-aligning contacts, each sidewall must be at least 0.5 μm thick in consideration of withstand voltage and leakage.

In this way, the power MOS transistors must have sidewalls each of at least 0.5 μm in width W. According to the prior art, an insulation film for forming the sidewalls must be thick so as to unavoidably increase the quantity of over-etching. The thick insulation film results in etching parts such as LOCOS and Si, surfaces of which must not be etched, thereby deteriorating elemental properties. Accordingly, it is practically impossible for the prior art to form sidewalls for the power MOS transistors. The embodiment of the invention never raises such problems and is practically useful because it can reduce the thickness of the CVD silicon oxide film 15 (sidewall forming insulation film).

Figure 19:
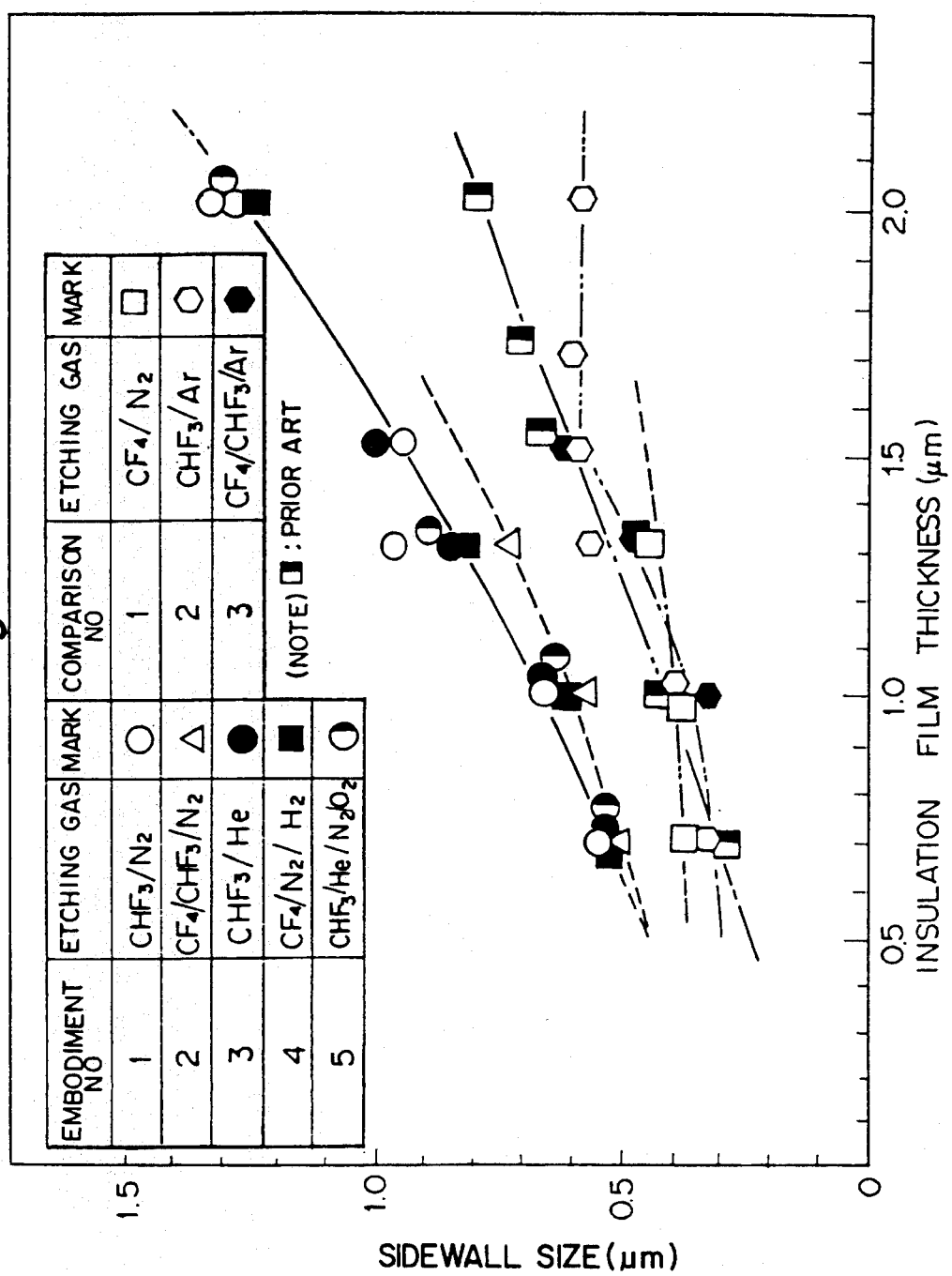
FIG. 19 is a graph showing relationships between insulation film thicknesses and sidewall sizes.

Tests have been made with a magnetron enhanced reactive ion etching apparatus and various etching gases. Tables 2 and 3 show the conditions of the tests, and FIG. 19 shows the results of the tests.

TABLE 2

| | Embodiments | | | |
|---|---|---|---|---|
| | Second $CF_4/CHF_3/N_2$ | Third $CHF_3/He$ | Fourth $CF_4/N_2/H_2$ | Fifth $CHF_3/He/N_2/O_2$ |
| Flow rate (cc/min) | | | | |
| $CHF_3$ | 25 | 50 | — | 70 |
| $CF_4$ | 25 | — | 50 | — |
| $N_2$ | 10 | — | 10 | 10 |
| Ar | — | — | — | — |
| He | — | 10 | — | 15 |
| $H_2$ | — | — | 20 | — |
| $O_2$ | — | — | — | 10 |
| High-frequency power (W) | | | | |
| | 600 | 600 | 600 | 600 |
| Pressure (Pa) | | | | |
| | 13 | 13 | 13 | 13 |

TABLE 3

| | Comparison | | |
|---|---|---|---|
| | First $CF_4/N_2$ | Second $CHF_3/Ar$ | Third $CF_4/CHF_3/Ar$ |
| Flow rate (cc/min) | | | |
| $CHF_3$ | — | 59 | 25 |
| $CF_4$ | 50 | — | 25 |
| $N_2$ | 10 | — | — |
| Ar | — | 10 | 10 |
| He | — | — | — |
| $H_2$ | — | — | — |
| $O_2$ | — | — | — |
| High-frequency power (W) | | | |
| | 600 | 600 | 600 |
| Pressure (Pa) | | | |
| | 13 | 13 | 13 |

The first comparison with $CF_4/N_2$, second comparison with $CHF_3/Ar$, and third comparison $CF_4/CHF_3/Ar$ each provide a small sidewall, which is substantially equal to that of the prior art of Table 1.

The second embodiment with $CF_4/CHF_3/N_2$, third embodiment with $CHF_3/He$, fourth embodiment with $CF_4/N_2/H_2$, and fifth embodiment with $CHF_3/He/N_2/O_2$ each show the same effect and the same wide sidewall as the first embodiment with $CHF_3/N_2$.

Figure 20:
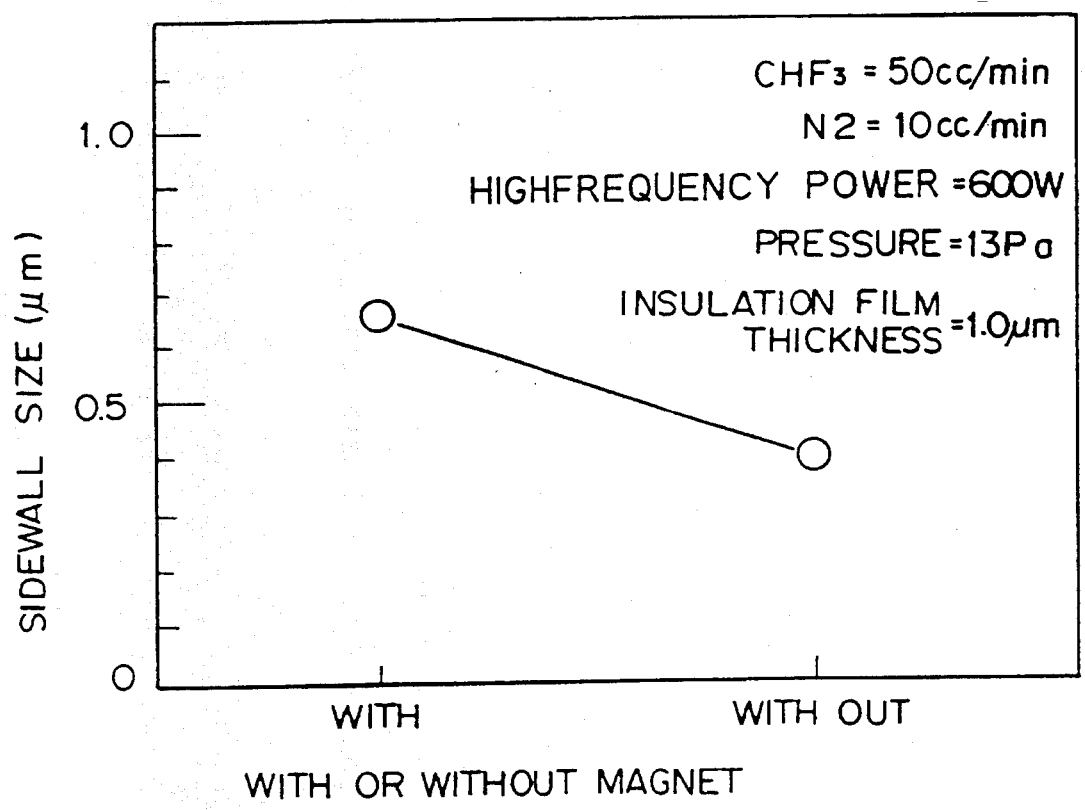
FIG. 20 is a graph showing sidewall sizes with and without a magnet.

FIG. 20 shows measurements of sidewalls prepared with and without a magnet. As shown in the figure, the sidewall prepared without the magnet has a smaller width than that prepared with the magnet.

These tests indicate that the magnet can increase the size of a sidewall owing to highly concentrated plasma produced by the magnet, hydrogen contained as gas components, and added $N_2$ or He gas. Namely, in FIG. 19, the first comparison and fourth embodiment indicate that $H_2$ is needed to widen the sidewall; the first comparison and first embodiment indicate that a gas ($CHF_3$) made by coupling carbon, hydrogen, and fluoride is needed; the second embodiment and third comparison indicate that an $N_2$ gas is needed, and the second comparison and third embodiment indicate that an He gas must be poured. Controlling the quantity of an $N_2$ or He gas in plasma gases controls the production of a polymer and thus the size of each sidewall.

The fifth embodiment employs gases of $CHF_3$, He, $N_2$, and $O_2$ produced by adding $O_2$ to the gas ($CHF_3/N_2$) of the first embodiment and the gas ($CHF_3/He$) of the third embodiment. The addition of the $O_2$ gas in the fifth embodiment remarkably improves the chamber cleaning cycle.

Figure 21:
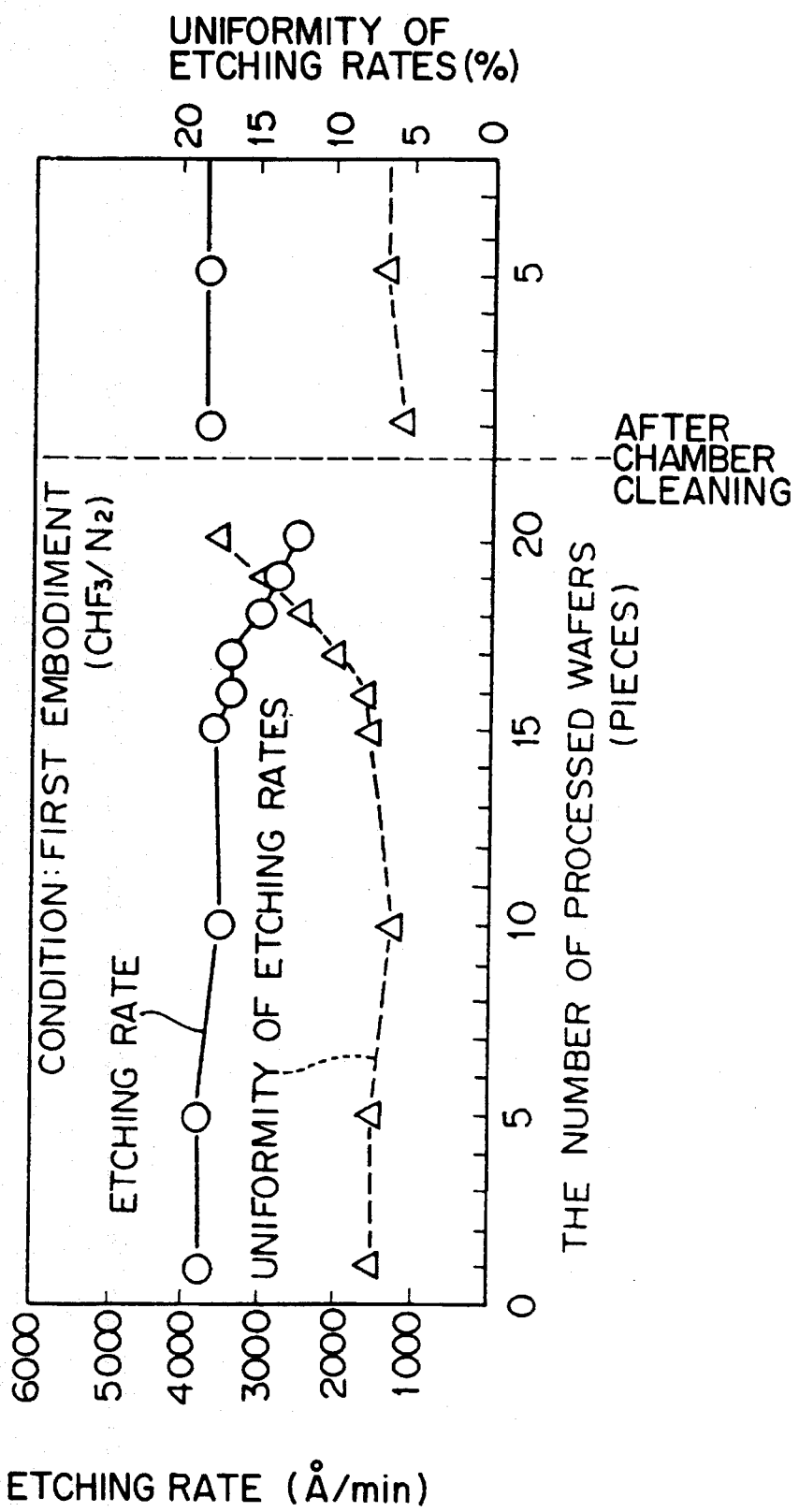
FIG. 21 is a graph showing relationships between the numbers of processed wafers and etching rates and uniformity of the etching rates.

FIG. 21 shows the number of processed wafers relative to etching rates and uniformity of the etching rates, in connection with the first embodiment ($CHF_3/N_2$). An abscissa of the figure represents the number of processed wafers and an ordinate thereof indicates mean etching rates of many sampling points of the wafers as well as uniformity {=(Vmax−Vmin)/(Vmax+Vmin)} of the etching rates V at the many sampling points of the wafers. The first embodiment shows a deterioration in the etching rates and the uniformity of the etching rates around 17 as the number of the processed wafers.

Figure 22:
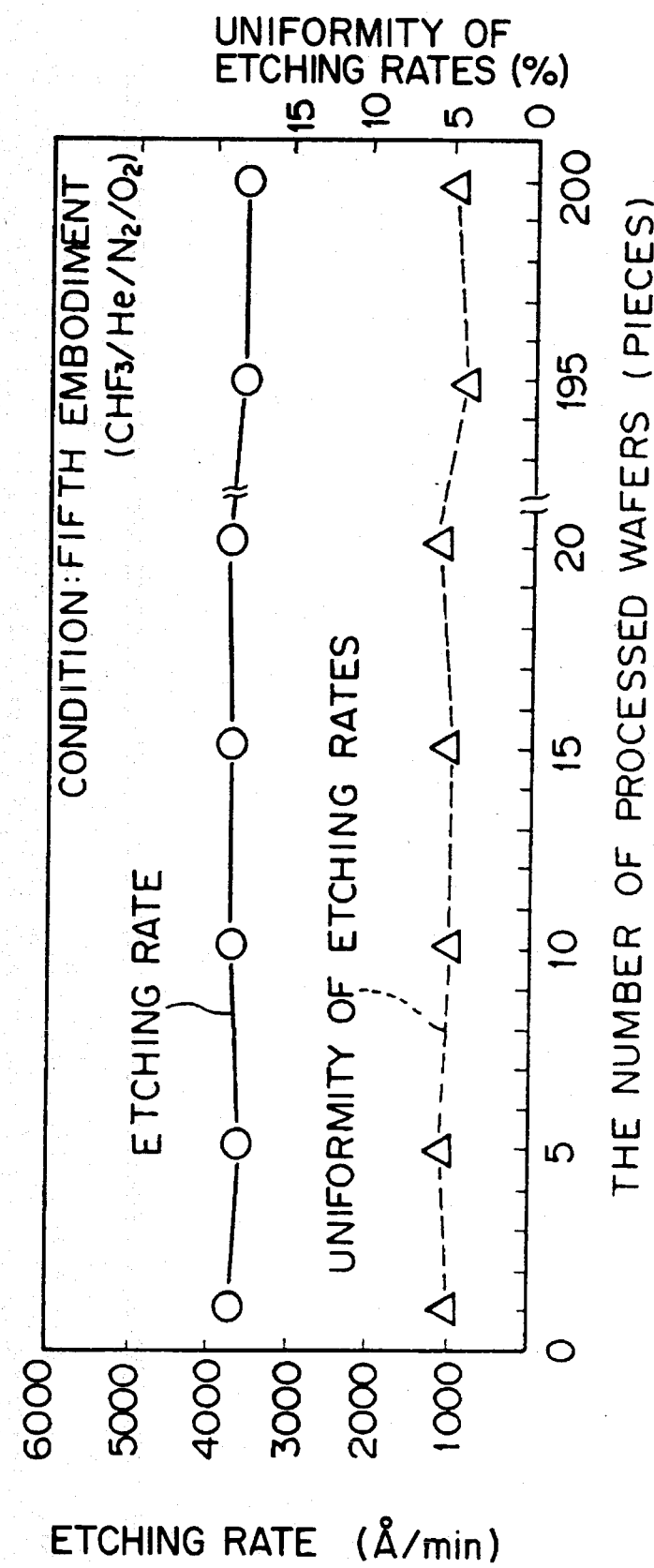
FIG. 22 is a graph showing relationships between the numbers of processed wafers and etching rates and uniformity of the etching rates.

FIG. 22 shows etching rates and uniformity of the etching rates relative to the number of processed wafers according to the fifth embodiment ($CHF_3/He/N_2/O_2$). According to this embodiment, the etching rates and uniformity of the etching rates do not deteriorate even after processing 200 wafers.

As a result, the first embodiment requires the inside of the chamber to be dry- or wet-cleaned after processing 17 wafers, to stabilize processes. On the other hand, the fifth embodiment ($CHF_3/He/N_2/O_2$) can process at least 200 wafers before cleaning the chamber, thereby greatly improving throughput, because the $CF_2^*$ of the formula (1) stains electrodes of the magnetron enhanced reactive ion etching apparatus, to deteriorate the discharging condition of the apparatus and because the added oxygen gas causes $CF_2^*$ and $O_2$ to react with each other and form $COF_2^*$ as shown in the formula (2), thereby preventing the electrodes of the magnetron enhanced reactive ion etching apparatus from staining, and thus extending the chamber cleaning cycle.

As modifications of the fifth embodiment, $CHF_3/N_2/O_2$, $CF_4/CHF_3/N_2/O_2$, or $CHF_3/He/O_2$ may be used, a $CO_2$ gas may be mixed with $CHF_3/N_2$, and $N_2O$ or CO may be added. Namely, an oxygen gas or a compound gas containing oxygen may be added.

Figure 23:
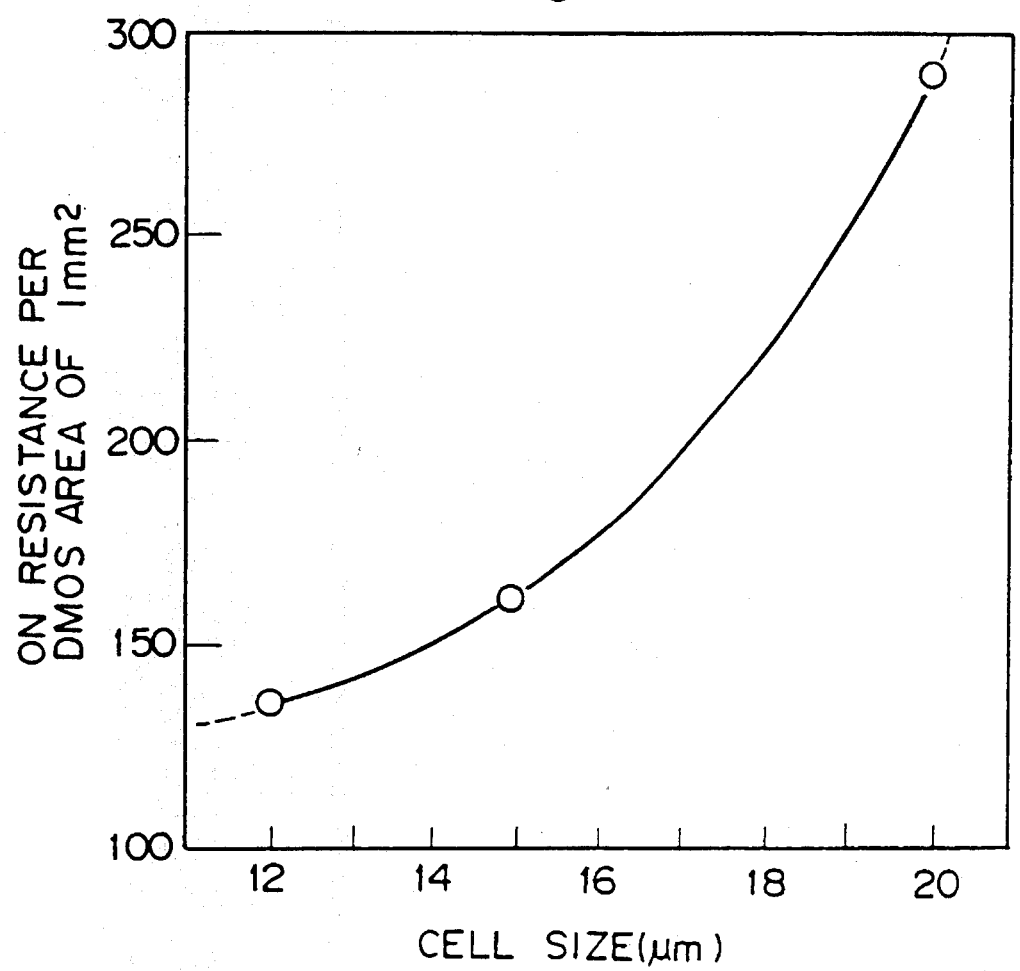
FIG. 23 is a graph showing relationships between cell sizes and ON resistance values.

FIG. 23 shows a relationship between cell size and an ON resistance value per DMOS area. This figure shows that a sidewall can reduce the cell size from 20 μm square to 15 μm square with the same withstand voltage. At this time, ON resistance is reduced from 290 mΩ.mm$^2$ to 160 mΩ.mm$^2$ as shown in FIG. 23. It is possible to reduce the cell size to 12 μm and the ON resistance to less than 160 mΩ.mm$^2$.

This invention is not limited to the above embodiments. When $N_2$ is added, the sidewall may be widened but a selection ratio of the sidewall forming insulation film and Si may deteriorate. To deal with this problem, the sidewall forming process may be divided into a process of etching and exposing the gate electrode material, etc., and an over-etching process that follows the etching process, as shown in Table 4. Namely, etching conditions may be switched from one to another. This technique stably forms sidewalls.

TABLE 4

|  | First step (Main etching) | Second step (Over-etching) |
|---|---|---|
| Flow rates (cc/min) |  |  |
| $CHF_3$ | 25 | 25 |
| $CF_4$ | 25 | 25 |
| $N_2$ | 10 | — |
| Ar | — | 10 |
| High-frequency power (W) |  |  |
|  | 600 | 600 |
| Pressure (Pa) |  |  |
|  | 13 | 13 |

The sidewall forming insulation film may be made of $SiO_2$ as well as BPSG, PSG, SiN, or SiON. The invention is applicable for the power MOS transistors as well as any semiconductor integrated circuits, such as DRAMs, that employ sidewalls.

The gate electrode material may be made of polysilicon as well as aluminum or silicide.

The gas made by coupling carbon, hydrogen, and fluoride and introduced into the magnetron enhanced reactive ion etching apparatus may be $CHF_3$ as well as $CH_2F_2$, $CH_3F$, or $C_2HF_5$.

The invention is applicable for etching electrode contact holes, enlarging each sidewall, and tapering the contact holes, thereby providing wiring with stepped portions properly covered. The sidewall technique of the invention may be applicable for forming a mask, which is used to form thinner gates.

As explained above in detail, the invention provides a novel method of broadening the width of a sidewall made from an insulation film at each side of an etched portion or a gate electrode portion. The invention, therefore, meets severe requirements of fabricating fine elements, to improve the withstand voltage of the elements and provide stable and simple wiring for the elements.

We claim:

1. A method of fabricating a semiconductor device comprising the steps of:

depositing silicon (Si)-based insulation material over a substrate having stepped portions provided on a main portion of the substrate, said stepped portions each having a height measured from said main surface thereof, wherein on each of the side surfaces of said stepped portions, a side wall portion comprising said silicon (Si)-based insulation material is provided, a laterally extending portion of said side wall portion having a width which is determined in accordance with said height of said stepped portion; and etching the silicon-based insulation material by a magnetron-enhanced reactive ion-etching apparatus while pouring onto the etched material carbon-fluoride (CF)-based gas mixed with hydrogen (H), nitrogen (N) or helium (He) gas, the nitrogen and helium gas do not directly contribute to said etching operation, and wherein said etching operation is carried out so as to deposit a polymer formed during said etching step on said sidewall to thereby expand said width of said laterally extending portion of said sidewall portion.

2. A method of fabricating a semiconductor device comprising the steps of:

forming on a main surface of a substrate, a plurality of stepped portions, each having a height, measured from said main surface of said substrate;

depositing silicon (Si)-based insulation material over said substrate provided with said stepped portions on said main surface thereof, wherein on each of the side surfaces of said stepped portions, a side wall portion comprising said silicon (Si)-based insulation material is provided, a laterally extending portion of said side wall portion having a width which is determined in accordance with said height of said stepped portion; and etching the whole surface of the silicon-based insulation material by a magnetron enhanced reactive ion etching apparatus while pouring carbon-fluoride (CF)-based gas containing hydrogen (H) atoms and a nitrogen (N) or helium (He) gas onto the etched material, and wherein said etching operation is carried out so as to deposit a polymer formed during said etching step on said sidewall to thereby expand said width of said laterally extending portion of said sidewall portion.

3. A method according to claim 2, wherein the step of etching the whole surface of the silicon-based insulation material by the magnetron enhanced reactive ion etching apparatus employs at least one processing material selected among a mixture of a carbon-fluoride (CF)-based gas and a hydrogen ($H_2$) gas and a gas made of carbon coupled with hydrogen, and fluorine and at least one gas selected from the group consisting of nitrogen (N) gas and a helium (He) gas.

4. A method according to claim 1, wherein the step of etching the whole surface of the silicon-based insulation material by the magnetron enhanced reactive ion etching apparatus employs at least one processing material selected among a mixture of a carbon-fluoride (CF)-based gas and a hydrogen ($H_2$) gas and a gas made of carbon coupled with hydrogen, and fluorine and at least one gas selected from the group consisting of nitrogen (N) gas and a helium (He) gas.

5. A method according to claim 2, wherein the stepped portions are made of gate electrode forming material.

6. A method according to claim 2, wherein the stepped portions are made of gate electrode forming material.

7. A method according to claim 1, wherein the step of etching the insulation film is conducted while adding an oxygen gas or a compound gas containing oxygen.

8. A method according to claim 2, wherein the step of etching the whole surface of the silicon-based insulation material by the magnetron enhanced reactive ion etching apparatus employs carbon-fluoride (CF)-based gas containing hydrogen (H) atoms and at least one processing material selected from the group consisting of a CF-based+$H_2$ gas and a CHF based gas.

9. A method according to claim 1, wherein the step of etching the insulation film is conducted while adding an oxygen gas or a compound gas containing oxygen.

10. A method according to claim 1, wherein the step of etching the whole surface of the silicon-based insulation material by the magnetron enhanced reactive ion etching apparatus employs carbon-fluoride (CF)-based gas containing hydrogen (H) atoms and at least one processing material selected from the group consisting of a CF-based+$H_2$ gas and a CHF based gas.

\* \* \* \* \*